United States Patent
Zang et al.

(10) Patent No.: US 10,540,115 B2
(45) Date of Patent: Jan. 21, 2020

(54) CONTROLLER ADAPTATION TO MEMORY PROGRAM SUSPEND-RESUME

(71) Applicant: SK hynix Inc., Gyeonggi-do OT (KR)

(72) Inventors: Wei Zang, Fremont, CA (US); Chun Hok Ho, Foster City, CA (US)

(73) Assignee: SK hynix Inc., Gyeonggi-do (KR)

( * ) Notice: Subject to any disclaimer, the term of this patent is extended or adjusted under 35 U.S.C. 154(b) by 82 days.

(21) Appl. No.: 15/135,270

(22) Filed: Apr. 21, 2016

(65) Prior Publication Data

US 2016/0313946 A1  Oct. 27, 2016

Related U.S. Application Data

(60) Provisional application No. 62/150,700, filed on Apr. 21, 2015.

(51) Int. Cl.
*G06F 12/00* (2006.01)
*G06F 3/06* (2006.01)
*G11C 29/04* (2006.01)

(52) U.S. Cl.
CPC .......... *G06F 3/0659* (2013.01); *G06F 3/0611* (2013.01); *G06F 3/0679* (2013.01); *G11C 2029/0411* (2013.01)

(58) Field of Classification Search
None
See application file for complete search history.

(56) References Cited

U.S. PATENT DOCUMENTS

| | | | | |
|---|---|---|---|---|
| 2004/0068623 | A1* | 4/2004 | Augsburg | G06F 12/0831 711/146 |
| 2012/0203986 | A1* | 8/2012 | Strasser | G06F 3/0611 711/158 |
| 2013/0205085 | A1* | 8/2013 | Hyun | G11C 16/10 711/114 |
| 2014/0040704 | A1* | 2/2014 | Wu | G06F 11/1068 714/773 |
| 2014/0075133 | A1* | 3/2014 | Li | G06F 12/00 711/154 |
| 2014/0156911 | A1* | 6/2014 | Alcantara | G06F 12/0246 711/103 |
| 2014/0215175 | A1* | 7/2014 | Kasorla | G06F 13/161 711/167 |
| 2014/0281083 | A1* | 9/2014 | Canepa | G06F 13/364 710/112 |
| 2015/0117113 | A1 | 4/2015 | Li et al. | |
| 2016/0306553 | A1* | 10/2016 | Ellis | G06F 3/0611 |
| 2018/0018133 | A1* | 1/2018 | Balakrishnan | G06F 3/0611 |

* cited by examiner

*Primary Examiner* — Baboucarr Faal
(74) *Attorney, Agent, or Firm* — IP & T Group LLP (57) ABSTRACT

Memory systems may include a memory including a plurality of dies, and a controller suitable for receiving a host read request during programming of one of the plurality of dies; determining a suspendable die among the plurality of dies based on a suspension threshold; and suspending the determined suspendable die and performing the received request.

19 Claims, 8 Drawing Sheets

CONTROLLER ADAPTATION TO MEMORY PROGRAM SUSPEND-RESUME

CROSS-REFERENCE TO RELATED APPLICATIONS

This application claims the benefit of U.S. Provisional Application No. 62/150,700 filed Apr. 21, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Aspects of the invention include memory systems. The memory systems may include a memory including a plurality of dies, and a controller suitable for receiving a host read request during programming of one of the plurality of dies; determining a suspendable die among the plurality of dies based on a suspension threshold; and suspending the determined suspendable die and performing the received request.

Further aspects of the invention include methods. The methods may include receiving, with a controller, a host read request during programming of one of a plurality of dies of a memory, determining a suspendable die among the plurality of dies based on a suspension threshold, and suspending the determined suspendable die and performing the received request.

Additional aspects of the invention include memory devices with a controller configured to receive a host read request during programming of one die of a plurality of dies, determine a suspendable die among the plurality of dies based on a suspension threshold, and suspend the determined suspendable die and performing the received request.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system a composition of matter; computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described n detail so that the invention is not unnecessarily obscured.

Figure 1:
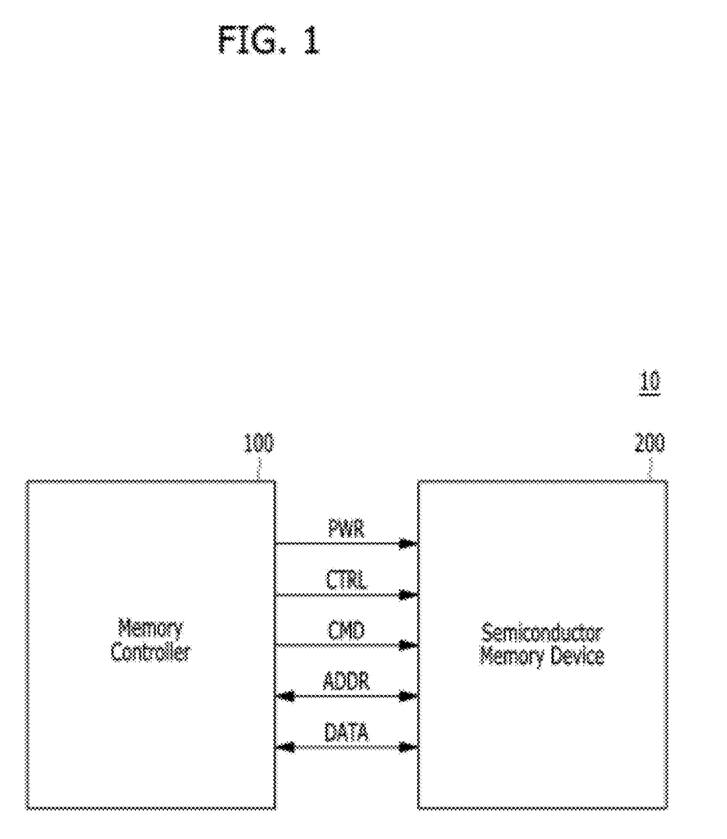
FIG. 1 is a block diagram schematically illustrating a memory system in accordance with an embodiment of the present invention.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADR and data DATA through input/output lines. The semiconductor memory device 200 may receive power PWR through a power line and a control signal CTRL through a control line. The control signal may include a command latch enable (CLE) signal an address latch enable (ALE) signal, a chip enable (CE) signal, a write enable (WE) signal, a read enable (RE) signal and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
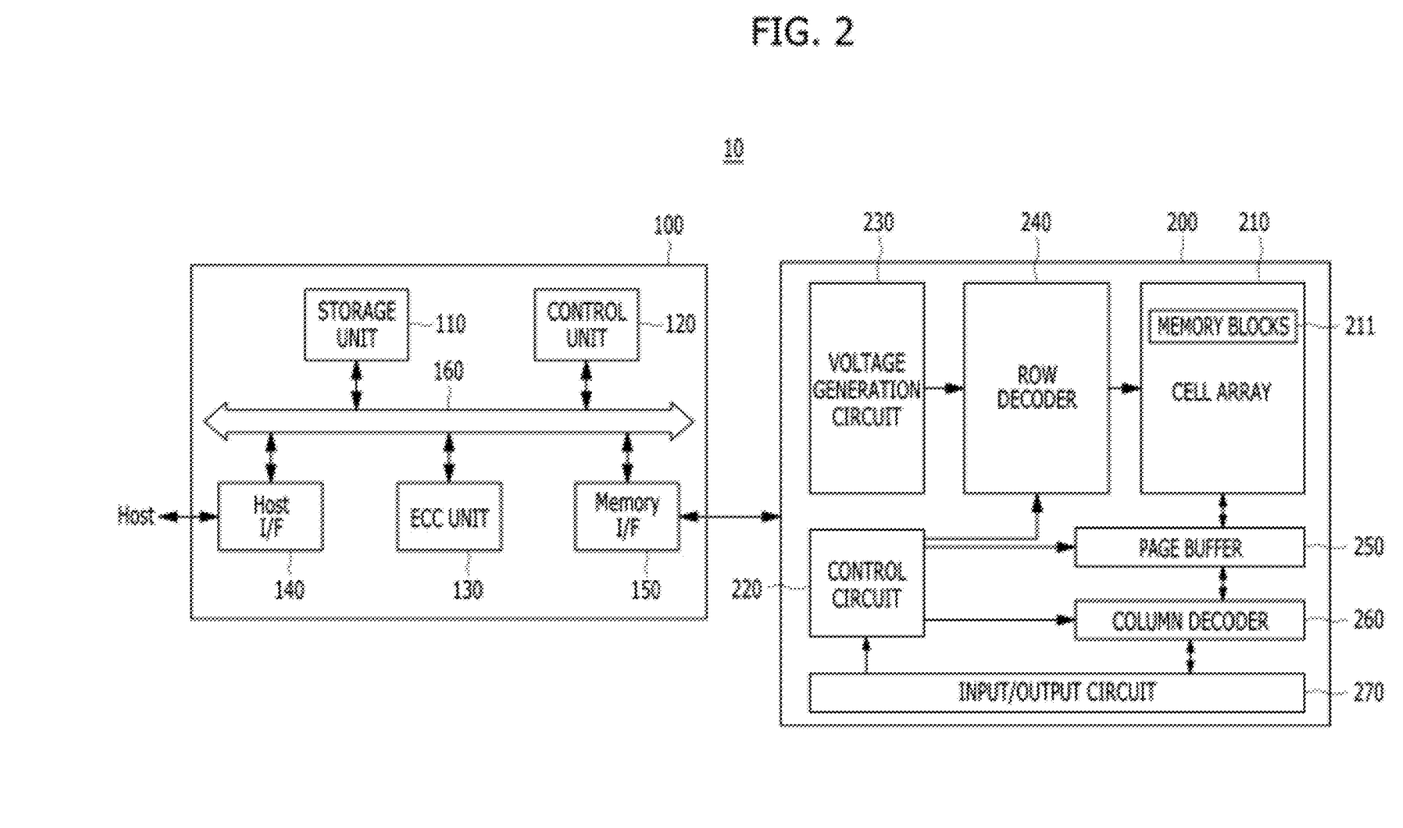
FIG. 2 is a block diagram illustrating a memory system in accordance with an embodiment of the present invention.

FIG. 2 is a detailed block diagram illustrating a memory system in accordance with an embodiment of the present invention. For example the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g, the memory controller 100), transmit data from the external device to the column decoder 260, or output data from the column decoder 260 to the external device, through the input/output circuit 270.

The control circuit 220 may control the peripheral circuit in response to the command and the address.

Figure 3:
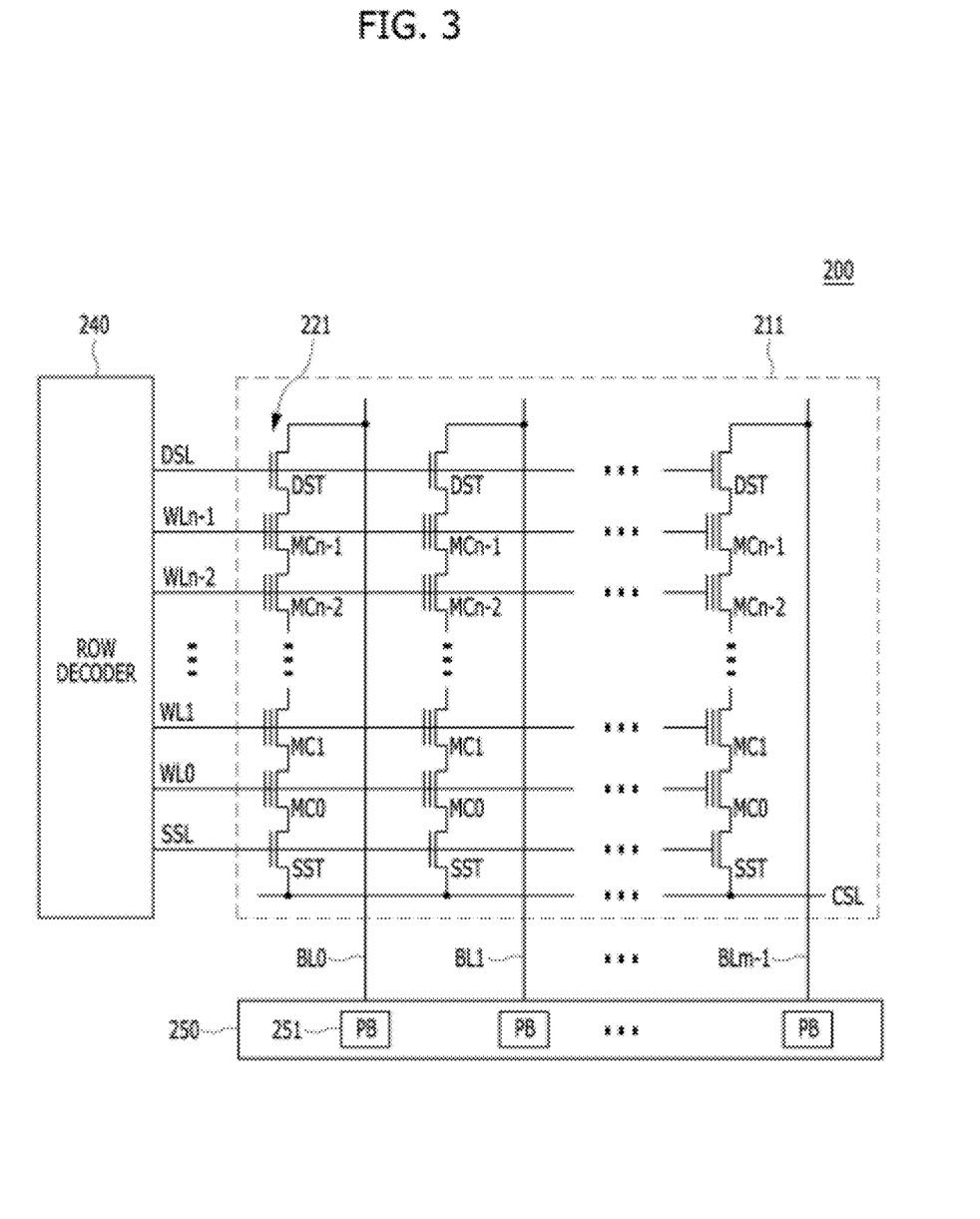
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1 respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined and one-NAND flash memory in which a controller is embedded inside a memory chip.

When a memory (NAND) device is serving a program request, the subsequent read requests issued to the die have to wait until the program completes. Typically, the die programming time is relatively long, which lengthens the read latency and may degrade the overall system performance (e.g, throughput and Quality-of-Service (QoS) latency).

A program suspend-resume feature may be used to improve those problems. Program suspend-resume suspends the on-going program in order to serve pending requests to the same die and then resumes the suspended program afterwards. The program suspend-resume feature enables early issue of read requests and thereby significantly reduces the read latency.

Figure 4:
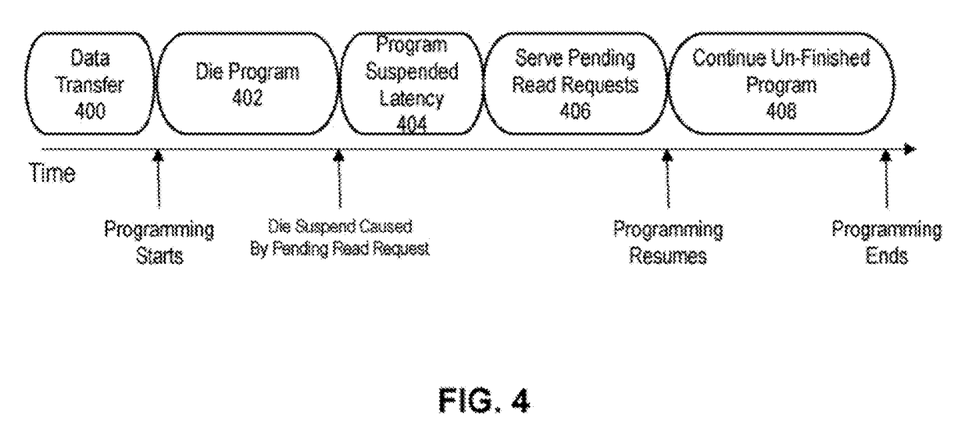
FIG. 4 is a diagram showing time flow of a suspend-resume program according to aspects of the invention.

FIG. 4 shows a program suspend-resume time flow in an example where die programming is suspended once. Data transfer occurs during block 400. Once the data transfer 400 is complete the programming (e.g., the program 402) begins. The die program 402 is suspended by a pending read request, and there is a program suspended latency time (block 404) that results from the suspension. At block 406, the pending read request is served and, upon completion of the read requests, programming resumes at block 408 until it is completed.

Figure 5:
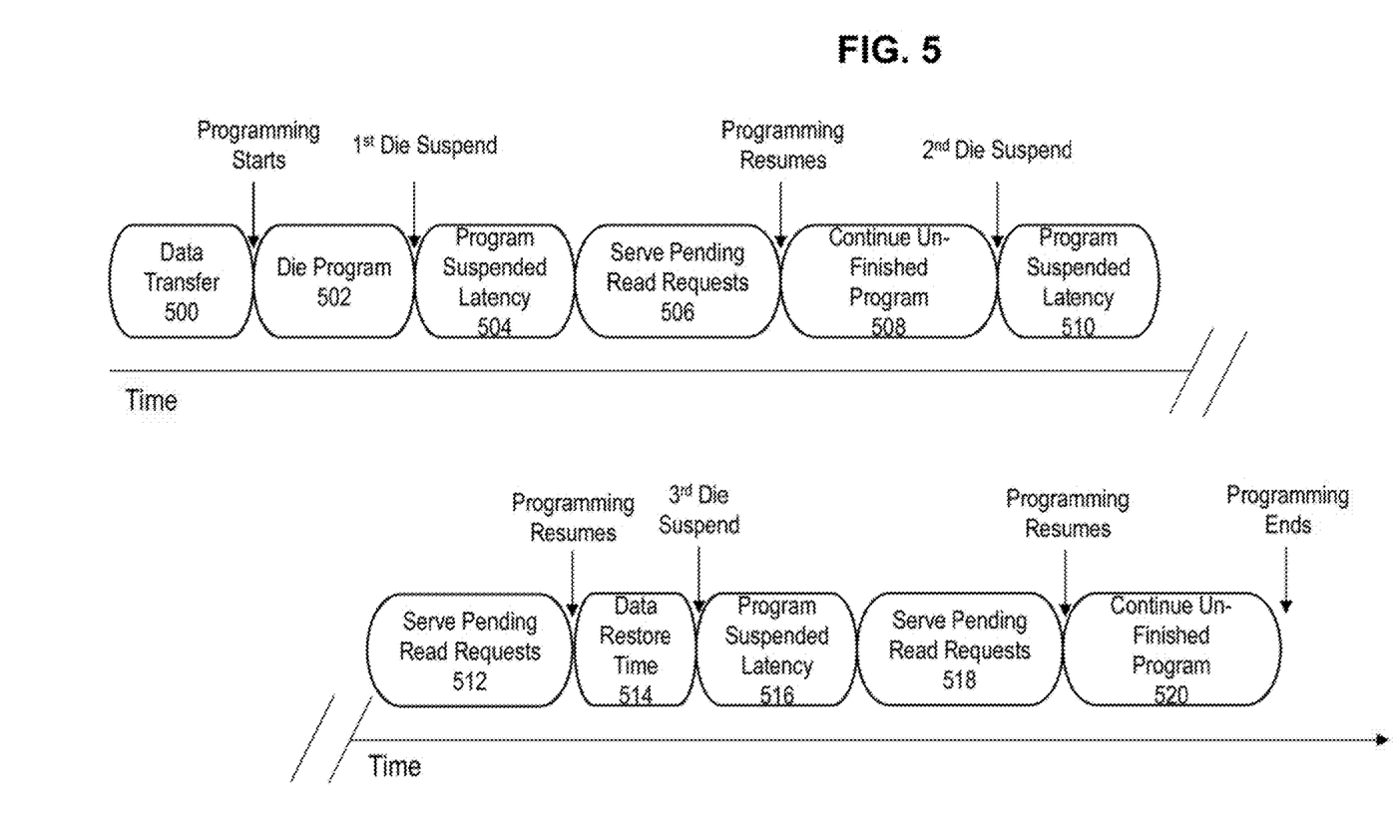
FIG. 5 is a diagram showing time flow of a repeated suspend-resume program according to aspects of the invention.

FIG. 5 shows a program suspend-resume time flow in an example where die programming is suspended multiple times. Data transfer 500 may begin and then die program 502 starts. Die program 502 will stop when a first die suspend command is received. The suspend command causes a program suspended latency 504 period, and then the pending read requests 506 are served. The unfinished programming then continues 508 until another suspend request is received. The suspend request causes another suspended latency period 510 and then the pending read requests are served 512. A time period for data restoring 514 may be utilized, but a $3^{rd}$ suspend request may be received during the data restoring period 514, causing another period of latency 516. The last set of pending requests 518 are served, and then programming resumes until finished 520.

Disclosed herein are systems, methods, and devices for improving host read latency and system performance with the program suspend-resume features.

In the controller, a Die Suspend Server may be used for each NAND die to record and control the die's suspend-resume states. Each die maintains the variable remainingProgramTime to indicate the remaining time to complete the suspended programing after resume. The maxSuspendedCount is introduced to limit the maximum number of reads to be, served during program suspension. To accommodate maxSuspendedCount, the number of already served read requests, numberOfServedReadRequests, during the suspension is recorded as well.

Figure 6:
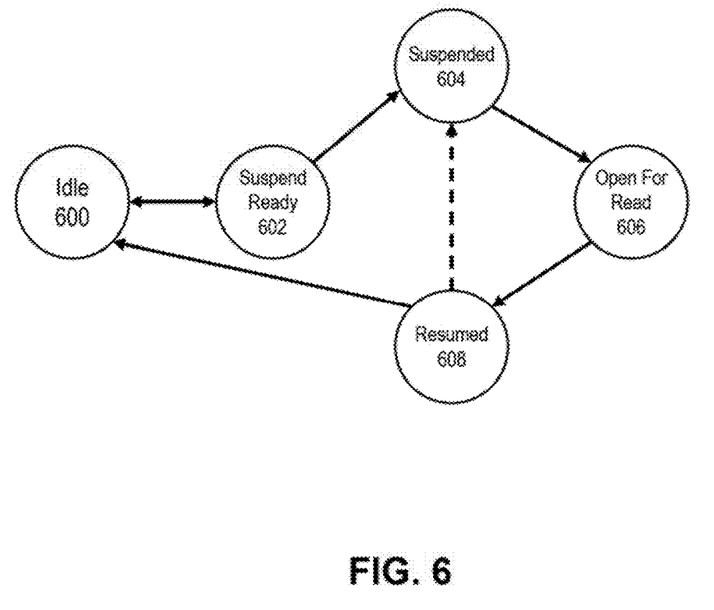
FIG. 6 is a flow diagram showing state transitions of a die in accordance with aspects of the invention.

FIG. 6 is a diagram depicting state transition for dies in accordance with aspects of the invention. Initially, the state is idle 600. After data transfer of the program is done, the state changes to suspend ready 602 to indicate the die is in programing and can be suspended. If there is no pending read request during the programing, the state changes back to idle 600 after the die finishes programing. Otherwise the pending read request suspends the die, and the state changes to suspended 604. After the suspend latency, the state changes to open for read 606 to indicate the die is able to serve pending read requests, and die status changes from busy to non-busy. After serving maxSuspendedCount (or less) number of host read requests, the suspended program is resumed 608 to continue. After remainingProgramTime, the resumed program completes and the state changes back to idle 600. Due to repeated suspend-resume, the die can be suspended again after resumed. For example, if the numberOfServedReadRequests is less than maxSuspendedCount, the new pending read requests can suspend the die and change the state from resumed 608 to suspended 604.

Figure 7:
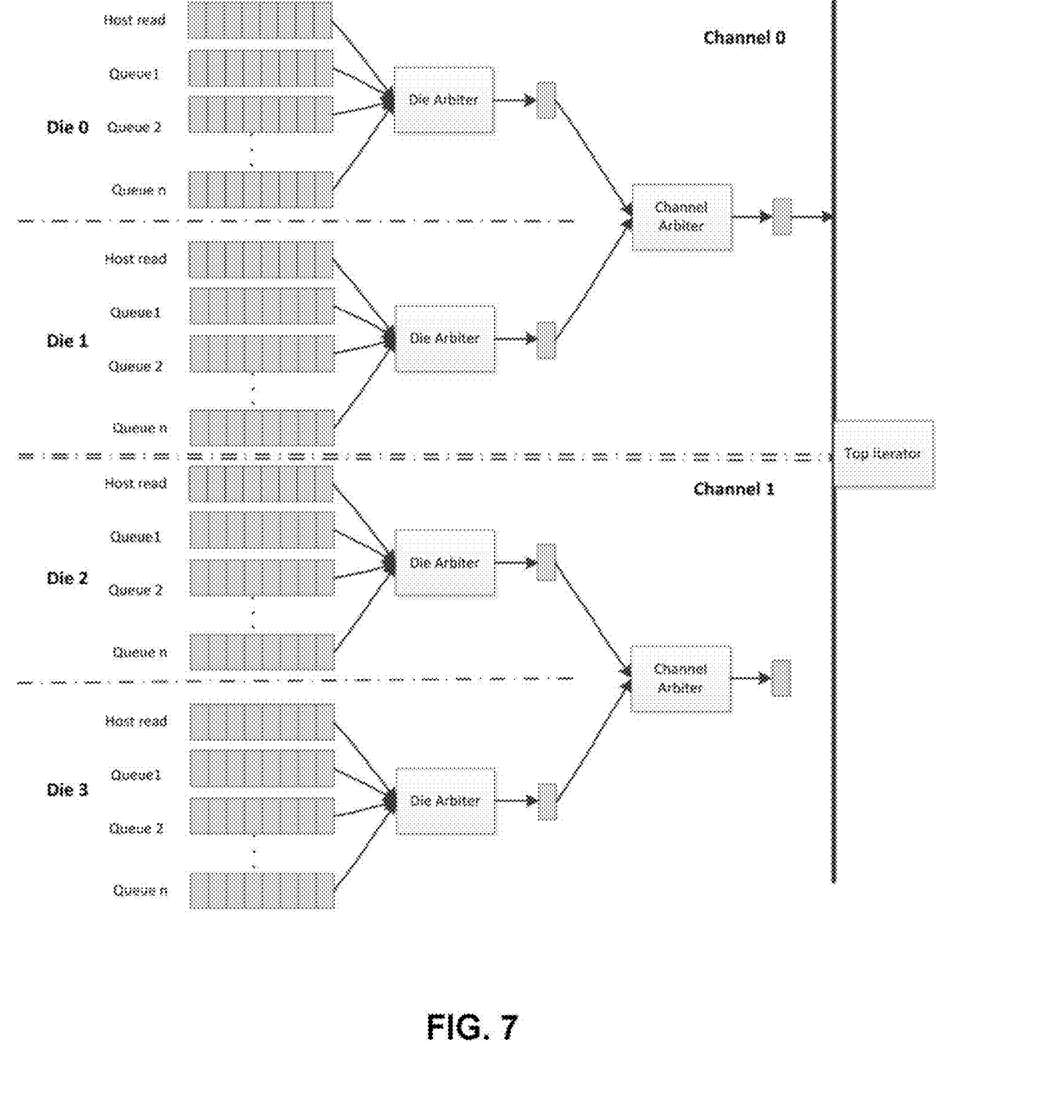
FIG. 7 is a diagram of a memory system according to aspects of the invention.

Referring next to FIG. 7, a structure of dies for a memory is shown. Host read, GC read, Host write, GC write, and other administration requests to dies are managed in queues and scheduled by die-level and channel-level arbiters. FIG. 7 depicts an example where a NAND device has two channels and each channel has two dies. In each die, different classes of requests can be maintained in different queues or multiple requests are maintained in one queue. The host read requests may be separated in a queue, which is referred to as HostRead queue, because only host read requests are allowed to be served during die suspension. A die arbiter selects a command from one of the queues, and then a channel arbiter selects one die's request among all dies connected to the channel.

Figure 8:
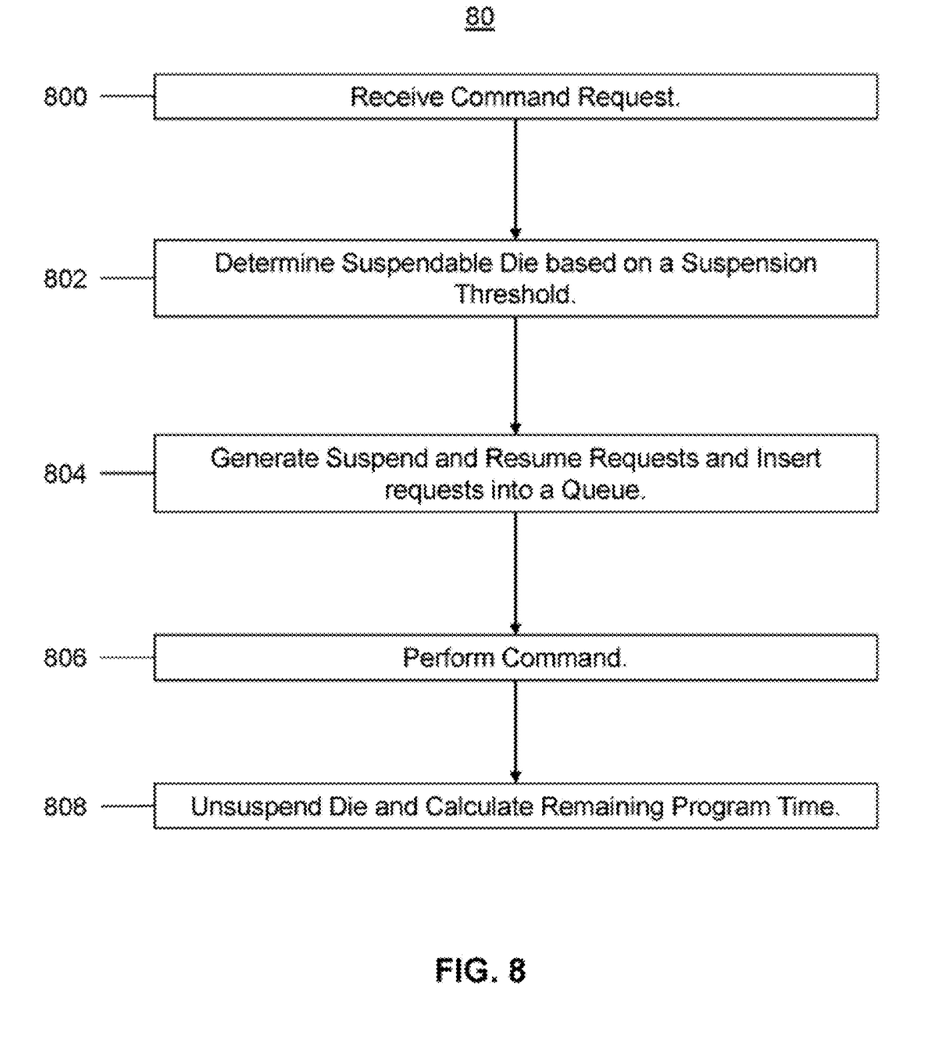
FIG. 8 is a flowchart of steps in a suspend-resume program according to aspects of the invention.

Referring next to FIG. 8, a flowchart 80 of steps in a program suspend-resume process are shown.

At step 800, a command request is received. In general, only requests from non-busy dies can be issued in a channel arbiter. When program suspend-resume is involved, a pending read request can be issued when the die is in the suspend ready or resumed state but still busy. Therefore, the busy but suspendable die should be considered as an arbitration candidate as well. The system may determine whether (and which) die is suspendable based on a suspension threshold. For example, when the state is in suspend ready, the suspension threshold may be met when RemainingProgramTime is larger than programSuspendLatency (e.g., suspend overhead). When the state is in resumed, the suspension threshold may be met when the numberOfServedReadRequests is less than maxSuspendedCount, and remainingProgramTime is larger than (pro gramSuspendLatency+dataRestoreTime) (e.g., repeat suspend-resume overhead).

At step 804, suspend and resume requests are generated and inserted into a queue. In order to effectively reduce the host read latency, in one embodiment, only host read requests are allowed to be served during the die suspension. Those of skill in the art will understand other command requests may be suitable for suspension from the disclosure herein. When scheduler arbitrates a pending host read request and the die is suspendable, suspend and resume requests will be generated and inserted into the corresponding die's HostRead queue. In an example, a suspend request is inserted into the head of the queue, and a resume request is inserted into a position dictated by the current HostRead queue length.

The number of read requests to be served during a suspension may be determined as Quota=maxSuspendCount−numberOfServedReadRequests. The position of the resume request to be inserted into the queue may be calculated as Postion=Quota+1 if the queue length is greater than or equal to Quota+1 or else the position will be the tail of the queue.

At step 806, the command is performed. Since after die suspension, only requests from the die's HostRead queue are served, the die arbiter locks the HostRead queue (which means the die arbiter only selects request from this queue) as soon as the suspend request is inserted into the queue. The die arbiter unlocks the queue when the resume request is successfully issued later on. The channel arbiter may grant highest priority to suspend and resume requests. If multiple dies have suspend/resume requests, the channel arbiter may follow round-robin arbitration scheme among these dies.

At step 808, the die is unsuspended and the remaining program time is calculated. Once the state enters into the suspend ready state, remainingProgramTime is initialized as die programing time, and the start programing time is recorded as lastRecordedTimeStamp for the future use. Once the state enters into the resumed state, the current time stamp is recorded as lastRecordedTimeStamp. Once the state enters into suspended state, if the state was transited from suspend ready to suspended, remainingProgramTime is calculated by remainingProgramTime=remainingProgramTime−(currentTimeStamp−lastRecordedTimeStamp). If the state transited from resumed to suspended, remainingProgramTime is calculated by remainingProgramTime=remainingProgramTime if (currentTimeStamp−lastRecordedTimeStamp) is less than or equal to dataRestoreTime. Otherwise, remainingProgramTime is calculated by remainingProgramTime−(currentTimeStamp−lastRecordedTimeStamp), if (currentTimeStamp−lastRecordedTimeStamp) greater than dataRestoreTime.

Die status polling may also be performed. Controllers monitor die status changes in order to determine the available resources for the next to-be-issued request. Due to the high polling cost, the controller polls die status when necessary. In normal die programing, since the die programming is going to be completed after die program time, the controller sets a time-out after die program time and polls the die status at the time-out. However, if the program was interrupted by a suspension when the time-out happens after die program time, controller should not poll the die status, and instead, a new time-out should be sent after remainingProgramTime when the resume request was successfully issued.

If a repeated suspend-resume happens, which means the die was suspended again during remainingProgramTime, controller should not poll the die status after remainingProgramTime time-outs that were set by previous resume requests. Thus, the latest resume request is recorded. When the time-out happens, controller checks whether the state is resumed and the time-out is caused by the last resume request before it starts polling die status.

The sustained mix-workload performance with program suspend-resume to the performance without program suspend-resume for NAND devices equipped with 3D TLC one-shot program was compared, experimenting with different OPs and different percentages of random read and random write combinations host traffic. Different maxSuspendedCount values of 1, 5, and 10 were used.

Although the foregoing embodiments have been described in some detail for purposes of clarity of understanding the invention is not limited to the details provided. There are many alternative ways of implementing the invention. The disclosed embodiments are illustrative and not restrictive.

What is claimed is:

1. A memory system, comprising:
a memory device including a plurality of dies, each having a plurality of queues, die arbiters, each in communication with the plurality of queues of a corresponding die, channel arbiters, each in communication with at least two of the die arbiters, and a controller for controlling the memory device, wherein each of the die arbiters is configured to:
select a command from one of the plurality of queues of the corresponding die;
wherein each of the channel arbiters is configured to select a request from a particular die among the dies in communication with the corresponding channel arbiter;
wherein the controller is configured to:
program the selected one of the plurality of dies in response to the selected command;
receive a host read request on the selected die during the programming of the selected die;
suspend the programming on the selected die and perform the host read request when a suspension threshold for a current state of the selected die is met, the current state of the selected die being one of a suspend ready state in which the suspension threshold is calculated using a first set of parameters, one of which is representative of suspend overhead, and a resumed state in which the suspension threshold is calculated using a second set of parameters, one of which is representative of suspend-continue overhead, the suspension threshold being updated dynamically in accordance with the state of the selected die; and
continue the programming on the selected die, without suspending programming thereon, when the suspension threshold is not met;
wherein the controller includes a die suspend server to record and control the states of each of the plurality of dies,
wherein execution of the suspend and continue operations reduces read latency.

2. The memory system of claim 1, wherein the controller is further configured to:
generate suspend and resume requests; and
insert the generated suspend and resume requests into a queue.

3. The memory system of claim 2, wherein the controller is further configured to insert a suspend request into a head of the queue.

4. The memory system of claim 1, wherein the first set of parameters includes a remaining program time and a program suspend latency time, and the suspension threshold for the selected die in the suspend ready state is determined to be satisfied when the remaining program time is greater than the program suspend latency time.

5. The memory system of claim 1, wherein the second set of parameters includes a number of served read requests and a max suspended count, and the suspension threshold for the selected die in the resumed state is determined to be satisfied when the number of served read requests is less than the max suspended count.

6. The memory system of claim 1, wherein the controller is further configured to calculate a remaining program time.

7. The memory system of claim 6, wherein the remaining program time is calculated based on the state of the selected die.

8. A method, comprising:
selecting, using a die arbiter, among a plurality of die arbiters, a queue, among a plurality of queues of a die, among a plurality of dies of a memory to be programmed, and selecting a request of the die, using a channel arbiter, among a plurality of channel arbiters, each in communication with at least two of the die arbiters, to select a command from the selected queue of the selected die, the plurality of die arbiters, the plurality of channel arbiters and the plurality of dies being components of a memory system;
programming the selected one of the plurality of dies in response to the selected command;
receiving, with a controller of the memory system, a host read request on the selected die during programming of the selected die;
suspending the programming on the selected die and perform the host read request when a suspension threshold for a current state of the selected die is met, the current state of the selected die being one of a suspend ready state in which the suspension threshold is calculated using a first set of parameters, one of which is representative of suspend overhead, and a resume state in which the suspension threshold is calculated using a second set of parameters, one of which is representative of suspend-continue overhead, the suspension threshold being updated dynamically in accordance with the state of the selected die;
continuing the programming on the selected die, without suspending programming thereon, when the suspension threshold is not met; and
recording and controlling the states of each of the plurality of dies,
wherein execution of the suspending and continuing steps reduces read latency.

9. The method of claim 8, further comprising:
generating suspend and resume requests; and
inserting the generated suspend and resume requests into a queue.

10. The method of claim 9, further comprising inserting a suspend request into a head of the queue.

11. The method of claim 8, wherein the first set of parameters includes a remaining program time and a program suspend latency time, and the suspension threshold for the selected die in the suspend ready state is determined to be satisfied when the remaining program time is greater than the program suspend latency time.

12. The method of claim 8, wherein the second set of parameters includes a number of served read requests and a max suspended count, and the suspension threshold for the selected die in the resumed state is determined to be satisfied when the number of served read requests is less than the max suspended count.

13. The method of claim 8, further comprising calculating a remaining program time.

14. The method of claim 13, wherein the remaining program time is calculated based on the state of the selected die.

15. A memory device comprising:
a plurality of dies, each having a plurality of queues, die arbiters, each in communication with the plurality of queues of a corresponding dies, channel arbiters, each in communication with at least two of the die arbiters, and a controller for controlling the memory device;
each of the arbiters being configured to:
select a command from one of the plurality of queues of the corresponding die;
each of the channel arbiters being configured to select a request from a particular die among the dies in communication with the corresponding channel arbiter; and
the controller being configured to:
program the selected one of the plurality of dies in response to the selected program command;
receive a host read request on the selected die during the programming of the selected die;
suspend the programming on the selected die and perform the host read request when a suspension threshold for a current state of the selected die is met, the current state of the selected die being one of a suspend ready state in which the suspension threshold is calculated using a first set of parameters, one of which is representative of suspend overhead, and a resumed state in which the suspension threshold is calculated using a second set of parameters, one of which is representative of suspend-continue overhead, the suspension threshold being updated dynamically in accordance with the state of the selected die;
continue the programming on the selected die, without suspending programming thereon, when the suspension threshold is not met; and
record and control the states of each of the plurality of dies using a die suspend server,
wherein execution of the suspend and continue operations reduces read latency.

16. The memory device of claim 15, wherein the first set of parameters includes a remaining program time and a program suspend latency time, and the suspension threshold for the selected die in the suspend ready state is determined to be satisfied when the remaining program time is greater than the program suspend latency time.

17. The memory device of claim 15, wherein the second set of parameters includes a number of served read request and a max suspended count, and the suspension threshold for the selected die in the resumed state is determined to be satisfied when the number of served read requests is less than the max suspended count.

18. The memory device of claim 15, wherein the controller is further configured to calculate a remaining program time.

19. The memory device of claim 18, wherein the remaining program time is calculated based on the state of the selected die.

* * * * *